United States Patent
Dequiedt et al.

(10) Patent No.: US 7,535,300 B2
(45) Date of Patent: May 19, 2009

(54) OPERATIONAL AMPLIFIER

(75) Inventors: Odile Dequiedt, Dresden (DE);
Wolfram Kluge, Dresden (DE)

(73) Assignee: Atmel Germany GmbH, Heilbronn (DE)

( * ) Notice: Subject to any disclaimer, the term of this patent is extended or adjusted under 35 U.S.C. 154(b) by 36 days.

(21) Appl. No.: 11/797,072

(22) Filed: Apr. 30, 2007

(65) Prior Publication Data
US 2008/0084245 A1 Apr. 10, 2008

(30) Foreign Application Priority Data
Apr. 28, 2006 (DE) .................. 10 2006 020 485

(51) Int. Cl.
*H03F 3/45* (2006.01)
(52) U.S. Cl. .................. 330/253; 330/263; 330/264
(58) Field of Classification Search .............. 330/253, 330/261, 263, 264
See application file for complete search history.

(56) References Cited

U.S. PATENT DOCUMENTS

| | | | | |
|---|---|---|---|---|
| 5,703,532 | A * | 12/1997 | Shin et al. ............... | 330/253 |
| 5,973,957 | A * | 10/1999 | Tedrow ................ | 365/185.03 |
| 6,249,153 | B1 * | 6/2001 | Moraveji ................ | 327/65 |
| 6,535,070 | B2 * | 3/2003 | Hwang et al. ............ | 331/57 |
| 6,542,019 | B1 | 4/2003 | Lim et al. | |
| 6,781,449 | B2 | 8/2004 | Schrodinger et al. | |
| 6,801,090 | B1 | 10/2004 | Abernathy | |
| 6,870,424 | B2 * | 3/2005 | Pradhan et al. .......... | 330/253 |
| 6,970,043 | B2 * | 11/2005 | Pradhan et al. .......... | 330/253 |
| 2003/0193492 | A1 | 10/2003 | Koyama | |

(Continued)

FOREIGN PATENT DOCUMENTS

EP 0633657 1/1995

(Continued)

OTHER PUBLICATIONS

Zolfaghari et al., "A Low-Power 2.4-GHz Transmitter/Receiver CMOS IC", IEEE Journal of Solid-State Circuits, vol. 38, No. 2, Feb. 2003; pp. 176-183.

(Continued)

*Primary Examiner*—Patricia Nguyen
(74) *Attorney, Agent, or Firm*—Muncy, Geissler, Olds & Lowe, PLLC

(57) ABSTRACT

An operational amplifier and use of an operational amplifier is provided that includes an input differential amplifier, which is connected to a first input and to a second input and a differential output stage, which is connected to the input differential amplifier and a first output and a second output. The differential output stage has a first branch with two first transistors, whose drain and/or collector are connected to one another and to the first output. The differential output stage has a second branch with two second transistors, whose drain and/or collector are connected to one another and to the second output. The first gates and/or the first bases of the two first transistors in the first branch are connected to one another and to a first output of the input differential amplifier. The second gates and/or the second bases of the two second transistors in the second branch are connected to one another and to a second output of the input differential amplifier. The differential output stage has a constant current source, which is connected to each branch to supply a current through the branches.

8 Claims, 2 Drawing Sheets

U.S. PATENT DOCUMENTS

2006/0012429 A1 1/2006 Kim
2006/0077584 A1 4/2006 Nainar
2007/0001760 A1 1/2007 Kwon et al.

FOREIGN PATENT DOCUMENTS

WO   WO-9914758      3/1999
WO   WO-01/73943 A1  10/2001

OTHER PUBLICATIONS

Cha et al., "A 5.2-GHz LNA in 0.35-um CMOS Utilizing Inter-Stage Series Resonance and Optimizing the Substrate Resistance", IEEE Journal of Solid-State Circuits, vol. 38, No. 4, Apr. 2003; pp. 669-672.

Hogervorst et al., "A Compact Power-Efficient 3V CMOS Rail-to-Rail Input/Output Operational Amplifier for VLSI Cell Librarier", Digest of Technical Papers, Feb. 1994.

Giustolisi et al., "1.2-V CMOS Op-Amp with a Dynamically Biased Output Stage", IEEE Journal of Solid-State Circuits, vol. 35, No. 4, Apr. 2000, pp. 632-636.

Seifert Manfred, "Analoge Schaltungen" [Analog Circuits], Verlag Technik GmbH, Berlin, 4$^{th}$ edition, 1994, pp. 276 to 286.

* cited by examiner

OPERATIONAL AMPLIFIER

This nonprovisional application claims priority under 35 U.S.C. § 119(a) on German Patent Application No. DE 10 2006 020 485.9, which was filed in Germany on Apr. 28, 2006, and which is herein incorporated by reference.

BACKGROUND OF THE INVENTION

1. Field of the Invention

The present invention relates to an operational amplifier, particularly to a battery-operated radio system.

2. Description of the Background Art

Amplifiers are required for a multitude of applications. Thus, amplifiers are used for filter circuits or for the amplification of measuring signals, for example, in sensor systems. A known amplifier circuit is, for example, the operational amplifier. Amplifiers can advantageously amplify a broad frequency range for a wide field of application. For some applications, it is also sufficient that the amplifier, as a selective amplifier, amplifies only a narrow frequency band within the range of an operating frequency.

An operational amplifier can have an input differential amplifier and an output stage. An operational amplifier is disclosed, for example, in "Analoge Schaltungen" [Analog Circuits], Seifart, $4^{th}$ edition, Verlag Technik Berlin, 1994, pages 276 to 286. The input stage of an operational amplifier is, for example, a differential amplifier. A differential amplifier is disclosed, for example, in "Analoge Schaltungen" [Analog Circuits], Seifart, $4^{th}$ edition, Verlag Technik Berlin, 1994, pages 107ff. The output voltage of the differential amplifier is proportional to the differential voltage between two input terminals. Common-mode voltages, which act at both inputs with the same amplitude and phase position, are not amplified by the ideal differential amplifier. The advantageous properties are conferred on the differential amplifier by its largely symmetric structure. The emitters of both input transistors can be connected to one another and to an input constant current source.

A low-power-2.4-GHz transmitter/receiver-CMOS IC with a differential amplifier is known from IEEE Journal of Solid-State Circuits, Vol. 38, No. 2, February 2003; pages 176ff. A 5.2-GHz, low-noise amplifier in 0.35 μm CMOS technology with a differential amplifier is known from IEEE Journal of Solid-State Circuits, Vol. 38, No. 4, April 2003.

A 3V CMOS Rail-to-Rail Input/Output Operational Amplifier for VLSI Cell Libraries is disclosed in IEEE International Solid-State Circuits Conference, 1994, Paper FA 14.1. A 1.2-V CMOS Operational Amplifier with Dynamically Biased Output Stage is disclosed in IEEE Journal of Solid-State Circuits, Vol. 35, No. 4, April 2000.

An electronic output stage for CMOS-LVDS levels (LVDS=low-voltage differential signaling) for use in analog and digital high-frequency circuits is known from patent No. WO 01/73943 A1, which corresponds to U.S. Pat. No. 6,781,449. The output stage has a first and a second transistor, which are connected with a first terminal to a current source and with a control terminal to input terminals. A third and fourth transistor are connected with a first terminal to a supply potential, with a second terminal to a second terminal of the first and second transistor, as well as to an output terminal, and with a control terminal to converted input signals. A differential amplifier, which is connected to the control terminal of the third and fourth transistors, is provided to convert the input signals. The differential amplifier is used to amplify and invert the input signals and to provide them with a voltage offset. It is also possible to set the desired output voltage at the output of the output stage via the high and low levels from the differential amplifier.

SUMMARY OF THE INVENTION

It is therefore an object of the present invention to provide an operational amplifier as simple as possible for the highest possible current drive strength.

Accordingly, an operational amplifier with at least one input differential amplifier and at least one output stage is provided. The input differential amplifier is connected to a first input and to a second input. The output stage is designed as a differential, so that it is connected to a first output and a second output of the operational amplifier. A useful signal amplified by the operational amplifier in this case is in phase opposition at the first output and at the second output.

The output stage may be connected indirectly to the input differential amplifier via another stage. The output stage can be connected directly to the input differential amplifier, however. The output stage has bipolar transistors or field-effect transistors.

The differential output stage can have a first branch with two first transistors, whose drain and/or collector are connected to one another and to the first output. The differential output stage, furthermore, can have a second branch with two second transistors, whose drain and/or collector are connected to one another and to the second output. Preferably, the first branch and the second branch are designed symmetrically. Preferably, the first branch and the second branch can have identical transistors. Identical transistors here are taken to mean transistors that may have minor differences from one another caused by manufacturing process tolerances.

The first gates and/or the first bases of the two first transistors in the first branch are connected to one another and to a first output of the input differential amplifier. The second gates and/or the second bases of the two second transistors are connected in the second branch to one another and to a second output of the input differential amplifier. The two first transistors and two second transistors connected in this manner are called a full bridge hereafter.

The same voltage is therefore always applied at both gate terminals and/or at both base terminals of the transistors of a branch. No stages are provided for setting a bias voltage that is different for the two gates and/or two bases of a branch.

The two transistors of a branch are preferably connected as a so-called push-pull stage. Preferably, each branch has an N-channel field-effect transistor (NMOS, N-JFET) and a P-channel field-effect transistor (PMOS, P-JFET). In the push-pull stage, in this regard, the source of the N-channel field-effect transistor is connected advantageously to ground or to a negative supply voltage terminal. Alternatively, the source of the P-channel field-effect transistor is preferably connected to a positive supply voltage terminal.

Alternatively, each branch has an npn bipolar transistor and a pnp bipolar transistor. In the push-pull stage, in this regard, the emitter of the npn transistor is connected advantageously to ground or to a negative supply voltage terminal. Alternatively, the emitter of the pnp transistor is preferably connected to a positive supply voltage terminal.

The full bridge is thereby preferably made of two push-pull stages (push-pull amplifier). The two branches are advantageously designed identical within the scope of manufacturing tolerances. The drain and/or collector of each transistor of a branch are connected to an output of the operational amplifier. Thus, the load terminals at the full bridge are formed in the bridge diagonals.

Furthermore, the differential output stage has a constant current source. The constant current source is connected to each branch to supply a current. For this purpose, the constant current source is connected to a source and/or an emitter of a transistor of the first transistors of the first branch and to a source and/or an emitter of a transistor of the second transistors of the second branch. A source and/or an emitter of the other transistor of the first transistors of the first branch are preferably connected to a supply voltage terminal. Moreover, preferably a source and/or an emitter of the other transistor of the second transistors of the second branch are connected to the supply voltage terminal. Consequently, the push-pull stages, formed by the transistors, are connected to the constant current source, and/or the constant current source is connected to the full bridge to supply a current via the full bridge.

If, for example, field-effect transistors are used in the differential output stage, the constant current flows through the supply by means of the constant current source across the drain-source paths of the transistors. At high frequencies, moreover, a small portion flows in or out as a displacement current across the gate capacitors and the gate terminals. If, for example, bipolar transistors are used in the differential output stage, the constant current flows through the supply by means of the constant current source across the collector/emitter paths of the transistors. A small portion, moreover, flows in or out as base current across the base terminals of the bipolar transistors. A constant current source in this case is taken to mean a current source or current drain depending the current flow direction.

According to a first embodiment, the two first transistors can be complementary bipolar transistors and the two second transistors, complementary bipolar transistors. According to a second embodiment, the two first transistors can be complementary field-effect transistors and the two second transistors, complementary field-effect transistors.

An aspect of the invention provides that the operating point of the output stage is set in such a way that at the operating points half of the constant current of the constant current source flows through the two first transistors of the first branch and the other half through the two second transistors of the second branch. Half of the current is not meant to be a mathematical half but a division by half of the current within the scope of operational amplifier manufacturing tolerances. The output current or the output voltage of the operational amplifier typically has a low offset because of these manufacturing tolerances.

The input differential amplifier has a first input transistor and a second input transistor. Moreover, a first source terminal and/or a first emitter terminal of the first input transistor and a second source terminal and/or a second emitter terminal of the second input transistor are connected to an input constant current source. According to an advantageous development of the invention, the constant current source of the differential output stage and the input constant current source of the input differential amplifier are connected to the same supply voltage terminal of the operational amplifier.

Another aspect of the invention is the use of an operational amplifier for a battery-operated radio system. In this case, the operational amplifier has an input differential amplifier and a differential output stage, which is connected to the input differential amplifier. The differential output stage has a first branch with a push-pull stage with two first transistors and a second branch with a push-pull stage with two second transistors. The differential output stage, furthermore, has a constant current source, which is connected to each push-pull stage to supply a current through the push-pull stages.

The previously described embodiments are especially advantageous both individually and in combination. In this regard, all development variants can be combined with one another. Some possible combinations are explained in the description of the exemplary embodiments in the figures. These possibilities of combinations of the further development variants, depicted there, are not definitive however.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
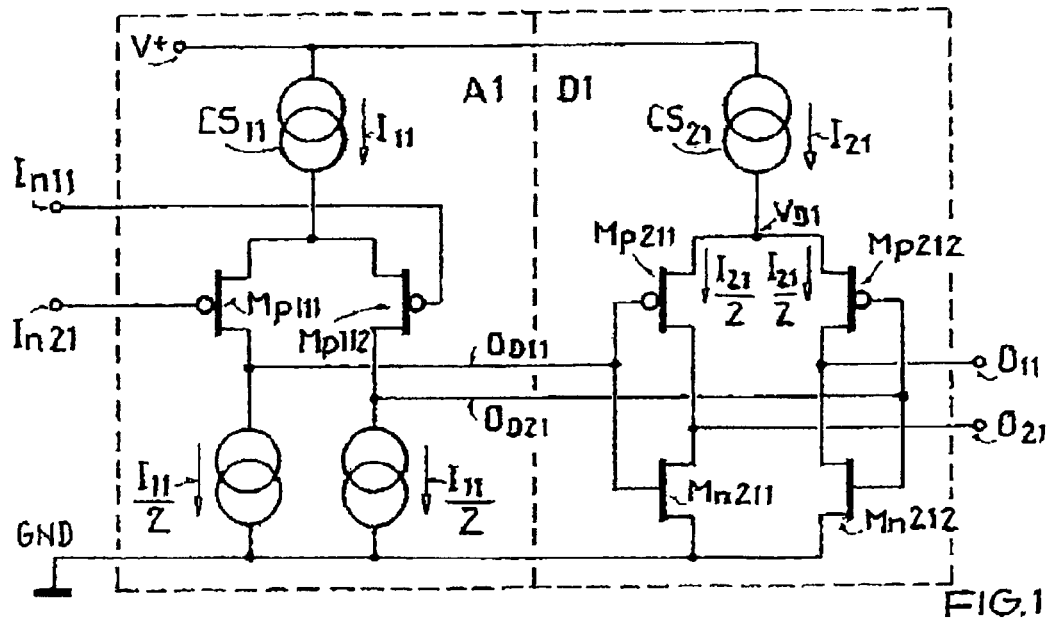
FIG. 1 shows a first schematic circuit diagram of a first exemplary embodiment of an operational amplifier.

FIG. 1 shows an exemplary embodiment of an operational amplifier. The goal of this exemplary embodiment of the operational amplifier is to achieve as low a current consumption as possible or a current drive strength as high as possible at a given operating current. The operational amplifier has an input differential amplifier A1, which is connected to a first input $In_{11}$ and to a second input $In_{21}$ of the operational amplifier. Furthermore, the operational amplifier has a differential output stage D1, which is connected to input differential amplifier A1 and to a first output $O_{11}$ and a second output $O_{21}$. The supply voltage V+ in the exemplary embodiment of FIG. 1 is 1.8 V.

Differential output stage D1 has two NMOS field-effect transistors $M_{P211}$, $M_{N211}$ and two PMOS field-effect transistors $M_{P212}$ and $M_{N212}$. In the exemplary embodiment of FIG. 1, MOSFETs of a CMOS technology are used as transistors $M_{P211}$, $M_{N211}$, $M_{P212}$, and $M_{N212}$. Alternatively, junction field-effect transistors may also be used.

Two push-pull stages may be used as the output stage. One of the two transistors of each push-pull stage (in the exemplary embodiment of FIG. 1, this is the PMOS field-effect transistor of a branch) is thereby not connected with the source terminal to the operating voltage V+, but to a constant current source $CS_{21}$.

A first branch of the differential output stage D1 has a PMOS transistor $M_{P211}$ and an NMOS transistor $M_{N211}$, which are preferably complementary. The gate terminals of both transistors $M_{P21}$ and $M_{N211}$ are directly connected to one another. Furthermore, the gate terminals of both transistors $M_{P211}$ and $M_{N211}$ are connected to an output $O_{D11}$ of the input differential amplifier A1.

Likewise, the drain terminals of both transistors $M_{P211}$ and $M_{N211}$ are connected directly to one another and to an output $O_{21}$ of output stage D1. The source terminal of NMOS transistor $M_{N211}$ is connected to a supply voltage terminal—here to ground GND. However, the source terminal of PMOS transistor $M_{P211}$ is connected to constant current source $CS_{21}$.

A second branch also has a PMOS transistor $M_{P212}$ and an NMOS transistor $M_{N212}$, which are preferably also complementary. The gate terminals of both transistors $M_{P212}$ and $M_{N212}$ are directly connected to one another. Furthermore, the gate terminals of both transistors $M_{P212}$ and $M_{N212}$ are connected to an output $O_{D21}$ of input differential amplifier A1.

Likewise, the drain terminals of both transistors $M_{P212}$ and $M_{N212}$ are connected directly to one another and to an output $O_{22}$ of output stage D1. The source terminal of NMOS transistor $M_{N212}$ is connected to a supply voltage terminal—here to ground GND. In contrast, the source terminal of PMOS transistor $M_{P212}$ is connected to the source terminal of PMOS transistor $M_{P211}$ of the other branch and to constant current source $CS_{21}$. Constant current source $CS_{21}$ is connected to a supply voltage terminal, here the positive supply voltage terminal V+.

The four transistors $M_{P211}$, $M_{N211}$, $M_{P212}$, $M_{N212}$ in the described connection can also be said to be a full bridge. Differential output stage D1 therefore has constant current source $CS_{21}$, which is connected to the full bridge to supply a current $I_{21}$ across the full bridge. Current $I_{21}$ across the full bridge is thereby determined exclusively by constant current source $CS_{21}$, provided no additional current is superposed on current $I_{21}$ of constant current source $CS_{21}$ through outputs $O_{11}$ or $O_{21}$ of output stage D1.

Constant current source $CS_{21}$, furthermore, is used to set the working point. Voltage $V_{D1}$ arises independently in that the first transistors of the first branch and the second transistors of the second branch are operated with constant current source $CS_{21}$.

Input differential amplifier A1 has two input transistors $M_{P111}$ and $M_{P112}$, which in the exemplary embodiment of FIG. 1 are designed as PMOS field-effect transistors. Alternatively, of course, other transistor types may be used, such as junction field-effect transistors. The gate terminal of the first input transistor $M_{P111}$ is connected to an input $In_{21}$ of the operational amplifier. The gate terminal of the second input transistor $M_{P112}$ is connected to another input $In_{11}$ of the operational amplifier. The source terminals of both input transistors $M_{P111}$ and $M_{P112}$ are connected directly to one another and to an input constant current source $CS_{11}$. Input constant current source $CS_{11}$ is in turn connected to a supply voltage terminal, here to the positive supply voltage terminal V+.

The drain terminal of first input transistor $M_{P111}$ is connected to an additional current source and to a first output $O_{D11}$ of input differential amplifier A1 and thus directly to the gate terminals of transistors $M_{P211}$ and $M_{N211}$ of differential output stage D1. The drain terminal of second input transistor $M_{P112}$ is connected to an again additional current source and to a second output $O_{D12}$ of input differential amplifier A1 and thus directly to the gate terminals of transistors $M_{P212}$ and $M_{N212}$ of differential output stage D1.

For the full bridge, connected to constant current source $CS_{21}$ of the exemplary embodiment of FIG. 1, in contrast to an AB amplifier, no driver circuit is necessary to provide bias or signal voltage to the gates of output transistors $M_{P211}$, $M_{N211}$, $M_{P212}$, and $M_{N212}$. This has the advantage that push-pull operation of this push-pull stage is achieved, without requiring additional expenditures for the driving of the output transistors $M_{P211}$, $M_{N211}$, $M_{P212}$, and $M_{N212}$. The maximum frequency to be amplified is determined by the electrical properties of output transistors $M_{P211}$, $M_{N211}$, $M_{P212}$, and $M_{N212}$ and not by additional amplifier stages.

The maximum drive strength is achieved when the transconductances of the PMOS field-effect transistors and the NMOS field-effect transistors are the same within the scope of manufacturing tolerances. In this case, a signal amplitude (peak-to-peak) of a maximum of $2 \times I_{21}$ can be supplied by the transistors of the first branch and of the second branch to the outputs $O_{11}$, $O_{21}$, whereby a quiescent current of $I_{21}/2$ flows in each of the two branches. A further possible advantage is that the circuit of FIG. 1 requires a low supply current, whereby current $I_{11}$ for input differential amplifier A1 is determined by constant current source $CS_{11}$ and current $I_{21}$ for output stage D1 by constant current source $CS_{21}$.

For a reliable operation of the input differential amplifier, in the exemplary embodiment of FIG. 1, it is possible only with difficulty to set the input common-mode voltage to half the supply voltage V+/2 of 0.9 V. The sum of the threshold voltages, Vdsat of the amplifier transistor, and Vdsat of input constant current source $CS_{11}$ in the exemplary embodiment of FIG. 1 is greater than 0.9 V. Thus, the practical input common-mode voltage can be 0.6 V to 0.7 V, whereby a symmetric modulation of output stage D1 is not necessary.

The common-mode control circuit, which is used preferably for the differential operational amplifier of FIG. 1, is not shown in FIG. 1 for the sake of a simplified presentation.

Figure 2:
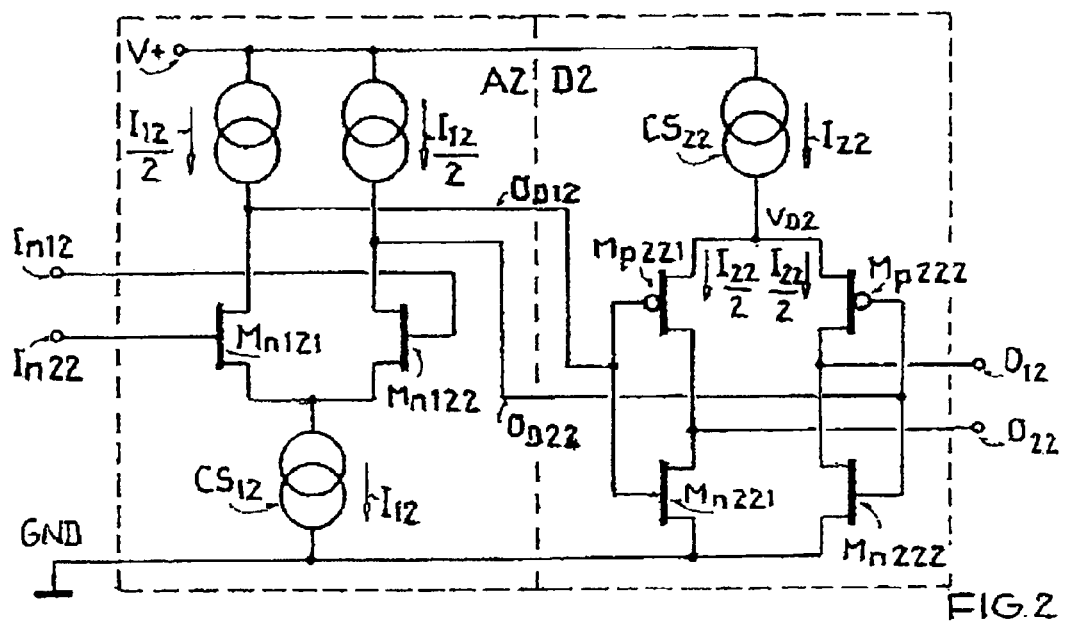
FIG. 2 shows a second schematic circuit diagram of a second exemplary embodiment of an operational amplifier.

Another exemplary embodiment for an operational amplifier is shown schematically as a circuit diagram in FIG. 2. Output stage D2 with constant current source $CS_{22}$ and transistors $M_{P221}$, $M_{N221}$, $M_{P222}$, and $M_{N222}$ does not differ from output stage D1 of FIG. 1. In contrast, input differential amplifier A2 has a first NMOS field-effect transistor $M_{N121}$ and a second NMOS field-effect transistor $M_{N122}$, whose gate terminals are connected to inputs $In_{12}$ and $In_{22}$ of the operational amplifier. Moreover, the source terminals of transistors $M_{N122}$, $M_{N121}$ are connected to an input constant current source $CS_{12}$. The input constant current source $CS_{12}$ is in turn connected to ground GND.

At inputs $In_{12}$ and $In_{22}$ there is an input signal, which can have both a common-mode signal portion and a differential-mode signal portion. A common-mode signal is taken to mean a signal that is applied at both inputs $In_{12}$ and $In_{22}$ of input differential amplifier A2 with the same frequency, same phase position, and same amplitude. A differential-mode signal is taken to mean a signal, applied at inputs $In_{12}$ and $In_{22}$, with the same frequency, same amplitude, and a phase shifted by 180°. Common-mode signals and differential-mode signals can also be superposed on one another. The differential-mode signal in this case is typically the useful signal.

The differential-mode signal is voltage-amplified by input differential amplifier A2 and via outputs $O_{D12}$ and $O_{D22}$ of input differential amplifier A2 reaches the gate terminals of transistors $M_{P221}$, $M_{N221}$, $M_{P222}$, and $M_{N222}$ of output stage D2. The gate electrodes of transistors $M_{P221}$, $M_{N221}$, $M_{P222}$, and $M_{N222}$ in this case represent a capacitive impedance as an additional load of input differential amplifier A2. The smaller this capacitive load, the higher the maximum amplifier frequency of input differential amplifier A2 that can be achieved. With a reduction in the capacitive load, however, the gate width of transistors $M_{P221}$, $M_{N221}$, $M_{P222}$, and $M_{N222}$ of output stage D2 is also reduced. This in turn reduces the current drive strength of output stage D2.

Figure 3:
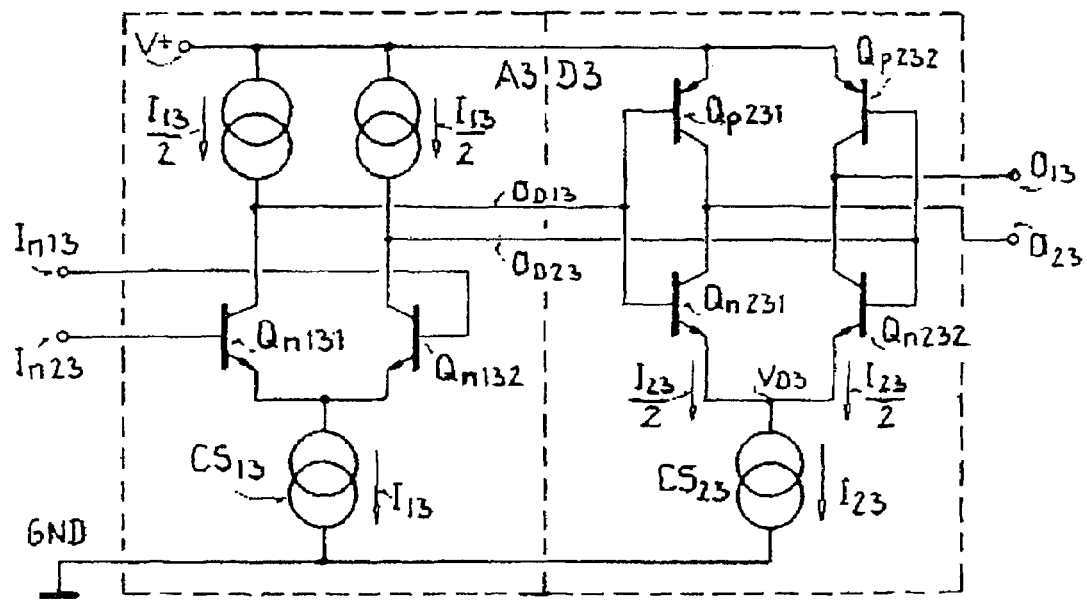
FIG. 3 shows a third schematic circuit diagram of a third exemplary embodiment of an operational amplifier.

Another exemplary embodiment for an operational amplifier is shown schematically in FIG. 3 in the form of a circuit diagram. In FIG. 3, bipolar transistors $Q_{P231}$, $Q_{N231}$, $Q_{P231}$, $Q_{P232}$, $Q_{N232}$, $Q_{N131}$, and $Q_{N132}$ are used for input differential amplifier A3 and for output stage D3.

Input differential amplifier A3 has npn bipolar transistors $Q_{N232}$ and $Q_{N131}$ as input transistors. The bases of input transistors $Q_{N232}$ and $Q_{N131}$ are connected to inputs $In_{13}$ and $In_{23}$ of the operational amplifier. The emitters of input transistors $Q_{N232}$ and $Q_{N131}$ are connected to an input constant current source $CS_{13}$, which in turn is connected to ground GND.

Output stage D3 has a first branch with a complementary npn bipolar transistor $Q_{N231}$ and pnp bipolar transistor $Q_{P231}$, whose bases are connected to one another and to an output $O_{D13}$ of the input differential amplifier A3. Furthermore, the collectors of npn bipolar transistor $Q_{N231}$ and of pnp bipolar transistor $Q_{P231}$ are connected to one another and to an output $O_{13}$ of output stage D3. The emitter of npn bipolar transistor $Q_{N231}$ is connected to a constant current source $CS_{23}$, which is again connected to ground GND. The emitter of pnp bipolar transistor $Q_{P231}$, in contrast, is connected to a supply voltage terminal, here to the positive supply voltage V+.

Furthermore, output stage D3 has a second branch with a complementary npn bipolar transistor $Q_{N232}$ and pnp bipolar transistor $Q_{P232}$. The emitter of npn bipolar transistor $Q_{N232}$ is connected to the emitter of npn bipolar transistors $Q_{N231}$ and to constant current source $CS_{23}$. Therefore, both the constant current source $CS_{23}$ of output stage D3 and the input constant current source $CS_{13}$ of input differential amplifier A3 are connected to the same supply voltage potential (here GND).

The exemplary embodiment of FIG. 3 is especially suitable for low supply voltages provided by a battery. To this end, preferably, especially low base-emitter voltages at the operating point and high current amplification factors of the bipolar transistors are advantageous. Heterobipolar transistors, for example, with a mixed silicon-germanium crystal, are used advantageously for especially high frequencies.

Figure 4:
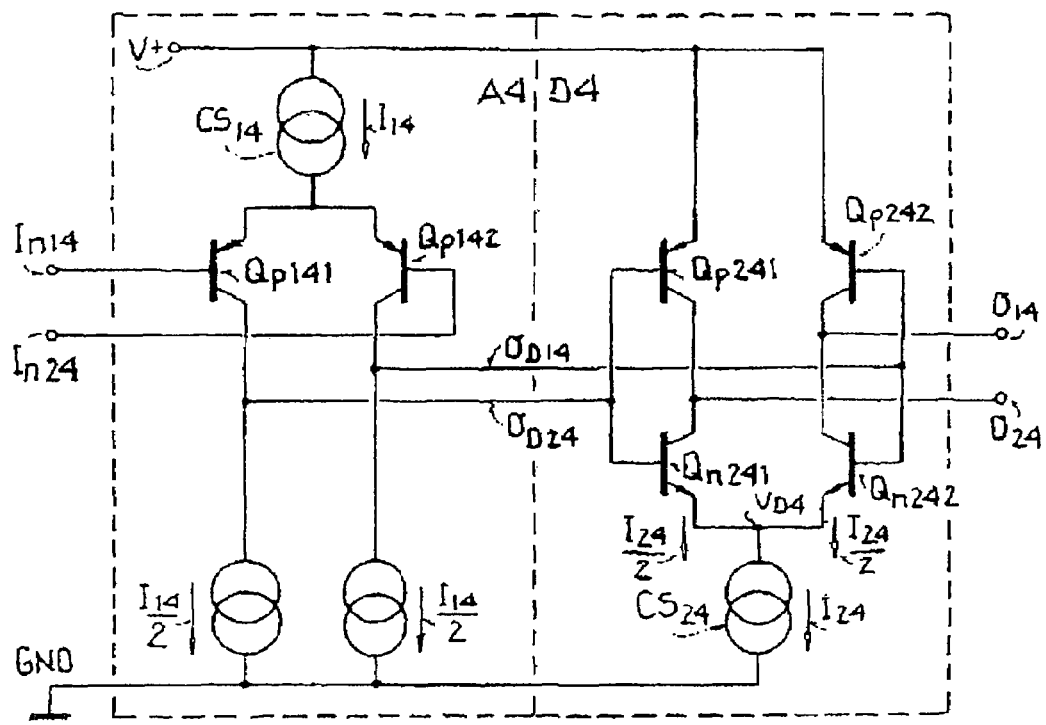
FIG. 4 shows a fourth schematic circuit diagram of a fourth exemplary embodiment of an operational amplifier.

FIG. 4 shows an again different exemplary embodiment of an operational amplifier using a schematic circuit diagram. In contrast to FIG. 3, input differential amplifier A4 has pnp bipolar transistors $Q_{P141}$ and $Q_{P142}$ as input transistors. The bases of input transistors $Q_{P141}$ and $Q_{P142}$ are connected to inputs $In_{14}$ and $In_{24}$ of the operational amplifier. The emitters of input transistors $Q_{P141}$ and $Q_{P142}$ are connected to an input constant current source $CS_{14}$, which in turn is connected to the positive supply voltage V+. The exemplary embodiment of FIG. 4 has the advantage that the base currents of transistors $Q_{P241}$, $Q_{N241}$, $Q_{P242}$, and $Q_{N242}$ need not be set separately by extra stages, but are set by the current distribution of current $I_{24}$ of constant current source $CS_{24}$ automatically at its operating point. Advantageously, transistors $Q_{P241}$, $Q_{N241}$, $Q_{P242}$, and $Q_{N242}$ for this purpose have the same current amplification within the scope of manufacturing tolerances.

The invention is not limited to the shown exemplary embodiments in the four figures, however. For example, in the exemplary embodiments of FIGS. 1 and 2, it is possible to use npn bipolar transistors instead of the NMOS field-effect transistors and pnp bipolar transistors instead of the PMOS field-effect transistors. For example, in the exemplary embodiments of FIGS. 3 and 4, it is possible to use NMOS field-effect transistors instead of the npn bipolar transistors and PMOS field-effect transistors instead of the pnp bipolar transistors. Likewise, combinations of bipolar transistors and field-effect transistors may also be used in the input differential amplifier and/or in the output stage. It is also possible to use transistors in a cascode circuit or in a Darlington circuit in the input differential amplifier and/or in the output stage in order to achieve a higher voltage amplification or current amplification.

The input differential amplifier is advantageously formed together with the differential output stage as an integrated circuit on a semiconductor chip.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An operational amplifier, comprising:
   a first input;
   a second input;
   an input differential amplifier, which is operatively connected to the first input and to the second input;
   a first output;
   a second output; and
   a differential output stage, which is operatively connected to the input differential amplifier and the first output and the second output,
   wherein the differential output stage has a first branch with two first transistors, whose drain and/or collector are connected to one another and to the first output,
   wherein the differential output stage has a second branch with two second transistors, whose drain and/or collector are connected to one another and to the second output,
   wherein the first gates and/or the first bases of the two first transistors in the first branch are connected to one another and to a first output of the input differential amplifier,
   wherein the second gates and/or the second bases of the two second transistors in the second branch are connected to one another and to a second output of the input differential amplifier, and
   wherein the differential output stage has a constant current source, which is connected to each branch to supply a current through the branches.

2. The operational amplifier according to claim 1, wherein the two first transistors are complementary bipolar transistors, and the two second transistors are complementary bipolar transistors.

3. The operational amplifier according to claim 1, wherein the two first transistors are complementary field-effect transistors and the two second transistors are complementary field-effect transistors.

4. The operational amplifier according to claim 1, wherein the operating point of the two first transistors in the first branch and the two second transistors in the second branch are set in such a way that half of the constant current of the constant current source flows through the two first transistors of the first branch and the other half through the two second transistors of the second branch.

5. An operational amplifier, comprising:
   a first input;
   a second input;
   an input differential amplifier, which is operatively connected to the first input and to the second input;
   a first output;
   a second output; and
   a differential output stage, which is operatively connected to the input differential amplifier and the first output and the second output,
   wherein the differential output stage has a first branch with two first transistors, whose drain and/or collector are connected to one another and to the first output, wherein the differential output stage has a second branch with two second transistors, whose drain and/or collector are connected to one another and to the second output, wherein the first gates and/or the first bases of the two first transistors in the first branch are connected to one another and to a first output of the input differential amplifier, wherein the second gates and/or the second bases of the two second transistors in the second branch are connected to one another and to a second output of the input differential amplifier, wherein the differential output stage has a constant current source, which is connected to each branch to supply a current through the branches, and wherein the input differential amplifier has a first input transistor and a second input transistor, wherein a first source terminal and/or a first emitter terminal of the first input transistor and a second source terminal and/or a second emitter terminal of the second input transistor are connected to an input constant current source, and wherein the constant current source of the differential output stage and the input constant current source of the input differential amplifier are connected to the same supply voltage terminal.

6. The operational amplifier according to claim 1, wherein the operational amplifier is for a battery-operated radio system.

7. The operational amplifier according to claim 1, wherein the differential output stage is configured to disconnect the first output and the second output of the operational amplifier from the first output and the second output of the differential amplifier.

8. An operational amplifier, comprising:
a first input;
a second input;
an input differential amplifier, which is operatively connected to the first input and to the second input;
a first output;
a second output; and
a differential output stage, which is operatively connected to the input differential amplifier and the first output and the second output, wherein the differential output stage has a first branch with two first transistors, whose drain and/or collector are connected to one another and to the first output, wherein the differential output stage has a second branch with two second transistors, whose drain and/or collector are connected to one another and to the second output, wherein the first gates and/or the first bases of the two first transistors in the first branch are connected to one another and to a first output of the input differential amplifier, wherein the second gates and/or the second bases of the two second transistors in the second branch are connected to one another and to a second output of the input differential amplifier, wherein the differential output stage has a constant current source, which is connected to each branch to supply a current through the branches, and wherein the input differential amplifier has a first input transistor and a second input transistor, wherein a first source terminal and/or a first emitter terminal of the first input transistor and a second source terminal and/or a second emitter terminal of the second input transistor are connected to an input constant current source.

* * * * *